United States Patent
He et al.

(10) Patent No.: US 12,058,925 B2
(45) Date of Patent: Aug. 6, 2024

(54) DISPLAY ASSEMBLY AND MANUFACTURING METHOD THEREOF AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Hui He, Beijing (CN); Zhiliang Jiang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 998 days.

(21) Appl. No.: 16/975,691

(22) PCT Filed: Nov. 28, 2019

(86) PCT No.: PCT/CN2019/121544
§ 371 (c)(1),
(2) Date: Aug. 25, 2020

(87) PCT Pub. No.: WO2021/102781
PCT Pub. Date: Jun. 3, 2021

(65) Prior Publication Data
US 2023/0095650 A1    Mar. 30, 2023

(51) Int. Cl.
*H10K 77/10* (2023.01)
*B32B 7/12* (2006.01)
(Continued)

(52) U.S. Cl.
CPC .............. *H10K 77/111* (2023.02); *B32B 7/12* (2013.01); *B32B 37/1284* (2013.01);
(Continued)

(58) Field of Classification Search
None
See application file for complete search history.

(56) References Cited

U.S. PATENT DOCUMENTS

| | | | |
|---|---|---|---|
| 9,356,087 B1 * | 5/2016 | Lee | H01L 27/1218 |
| 2016/0154268 A1 * | 6/2016 | Yamazaki | H10K 50/841 |
| | | | 445/24 |
| 2019/0259818 A1 * | 8/2019 | Jeon | H10K 50/844 |

FOREIGN PATENT DOCUMENTS

| | | |
|---|---|---|
| CN | 105977400 A | 9/2016 |
| CN | 107871451 A | 4/2018 |

(Continued)

*Primary Examiner* — Xiaoming Liu
(74) *Attorney, Agent, or Firm* — HOUTTEMAN LAW LLC

(57) ABSTRACT

The present disclosure provides a display assembly, including: a display panel which includes: a screen portion, a chip providing portion, a bendable portion located between the screen portion and the chip providing portion, and a spacer portion connected between the bendable portion and the screen portion; a blocking layer on the screen portion; a cured adhesive layer located outside an area of the screen portion and including: a first portion covering the bendable portion and a second portion covering the spacer portion, the first portion and the second portion each having an thickness less than that of the blocking layer, the second portion is in contact with the blocking layer, and a surface of the second portion distal to the spacer portion is substantially flat. The present disclosure also provides a manufacturing method of the display assembly and a display device.

20 Claims, 7 Drawing Sheets

(51) Int. Cl.
*B32B 37/12* (2006.01)
*H10K 71/00* (2023.01)
*H10K 102/00* (2023.01)

(52) U.S. Cl.
CPC .......... *H10K 71/00* (2023.02); *B32B 2307/42* (2013.01); *B32B 2457/206* (2013.01); *H10K 2102/311* (2023.02)

(56) References Cited

FOREIGN PATENT DOCUMENTS

| | | |
|---|---|---|
| CN | 108281387 A | 7/2018 |
| CN | 108682307 A | 10/2018 |
| CN | 108877514 A | 11/2018 |
| CN | 109062439 A | 12/2018 |
| CN | 110491883 A | 11/2019 |
| KR | 20180060710 A | 6/2018 |

* cited by examiner

US 12,058,925 B2

DISPLAY ASSEMBLY AND MANUFACTURING METHOD THEREOF AND DISPLAY DEVICE

CROSS REFERENCE TO RELATED APPLICATION

This application is a National Phase Application filed under 35 U.S.C. 371 as a national stage of PCT/CN2019/121544, filed on Nov. 28, 2019, the contents of which are incorporated herein by reference in their entirety.

TECHNICAL FIELD

The present disclosure relates to the field of display technology, and in particular to a display assembly and a manufacturing method thereof, and a display device.

BACKGROUND

In a display device, one end of a display panel is bent to a backlight side for providing driving chips. In order to protect the bent portion of the display panel from being damaged, an adhesive is generally coated on the bent portion and cured.

SUMMARY

An embodiment of the present disclosure provides a display assembly and a manufacturing method thereof, and a display device.

According to an aspect of the present disclosure, there is provided a display assembly including:
- a display panel, including: a screen portion, a chip providing portion, a bendable portion between the screen portion and the chip providing portion, and a spacer portion between the bendable portion and the screen portion;
- a blocking layer on the screen portion;
- a cured adhesive layer outside an area of the screen portion and including: a first portion covering the bendable portion and a second portion covering the spacer portion, the first portion and the second portion each having a thickness less than that of the blocking layer, wherein the second portion is in contact with the blocking layer, and a surface of the second portion distal to the spacer portion is substantially flat.

In an embodiment, the cured adhesive layer further includes: a third portion on the chip providing portion, and a thickness of the third portion is gradually reduced along a direction far away from the bendable portion.

In an embodiment, a surface of the third portion distal to the spacer portion is a bevel.

In an embodiment, the cured adhesive layer further includes: a fourth portion on the chip providing portion, the fourth portion is connected between the first portion and the third portion, and a surface of the fourth portion distal to the chip providing portion is substantially flat.

The bendable portion is in a bent state, and the chip providing portion is on a backlight side of the screen portion.

In an embodiment, the blocking layer is on a surface of the screen portion distal to the chip providing portion, a first back membrane is provided on a surface of the screen portion proximal to the chip providing portion, and the second portion of the cured adhesive layer at least partially overlaps the first back membrane in a thickness direction of the screen portion.

In an embodiment, a boundary of the first portion of the cured adhesive layer close to the bendable portion is flush with a boundary of the first back membrane close to the bendable portion.

In an embodiment, the chip providing portion has a first surface distal to the screen portion and a second surface proximal to the screen portion, a part of the cured adhesive layer is on the first surface of the chip providing portion, a second back membrane is on the second surface of the chip providing portion, and the cured adhesive layer on the first surface of the chip providing portion at least partially overlaps the second back membrane in a thickness direction of the chip providing portion.

In an embodiment, a thickness of the first portion of the cured adhesive layer is in a range of 60 μm to 120 μm.

In an embodiment, the second portion of the cured adhesive layer has a thickness in a range of 60 μm to 90 μm.

In an embodiment, the blocking layer is a protection film.

In an embodiment, the blocking layer is a polarizer.

According to another aspect of the present disclosure, there is provided a display device including the display assembly according to an embodiment of the present disclosure.

According to further aspect of the present disclosure, there is provided a manufacturing method of a display assembly including the following steps:
- preparing a display panel, the display panel including: a screen portion, a chip providing portion, a bendable portion located between the screen portion and the chip providing portion, and a spacer portion connected between the bendable portion and the screen portion;
- forming a blocking layer on the screen portion;
- forming an adhesive layer on the display panel;
- curing the adhesive layer, wherein the cured adhesive layer is located outside an area of the screen portion, and the cured adhesive layer includes: a first portion covering the bendable portion and a second portion covering the spacer portion, the first portion and the second portion each having a in thickness less than that of the blocking layer, wherein the second portion is in contact with the blocking layer, and a surface of the second portion distal to the spacer portion is substantially flat.

In an embodiment, the step of forming an adhesive layer on the display panel includes the following step: coating adhesive along a direction from the screen portion to the chip providing portion, starting from a position adjacent to the blocking layer, to form the adhesive layer.

In an embodiment, the coating adhesive along a direction from the screen portion to the chip providing portion comprises coating adhesive starting from the position adjacent to the blocking layer to an end position located on the chip providing portion such that the cured adhesive layer further includes: a third portion provided on the chip providing portion, and a thickness of the third portion is gradually reduced along a direction far away from the bendable portion.

In an embodiment, the cured adhesive layer further includes: a fourth portion provided on the chip providing portion, wherein the fourth portion is connected between the first portion and the third portion, a surface of the fourth portion distal to the chip providing portion is substantially flat.

In an embodiment, the step of curing the adhesive layer further includes the following step:

bending the display panel along the bendable portion, so that the chip providing portion is located on a backlight side of the screen portion, wherein the bendable portion is in a bent state.

In an embodiment, before the step of bending the display panel along the bendable portion, the method further includes the following step:

forming a first back membrane on a surface of the screen portion distal to the blocking layer, wherein the second portion of the cured adhesive layer at least partially overlaps the first back membrane in a thickness direction of the screen portion.

In an embodiment, a part of the cured adhesive layer is located on a first surface of the chip providing portion, before the step of bending the display panel along the bendable portion, the method further includes the following step: forming a second back membrane on a second surface of the chip providing portion, wherein the cured adhesive layer on the first surface of the chip providing portion at least partially overlaps the second back membrane in a thickness direction of the chip providing portion;

the bending the display panel along the bendable portion comprises bending the display panel along the bendable portion such that the first surface of the chip providing portion is distal to the screen portion, and the second surface of the chip providing portion is proximal to the screen portion.

BRIEF DESCRIPTION OF DRAWINGS

Accompanying drawings, which are included to provide a further understanding of the present disclosure and are incorporated in and constitute a part of this specification, illustrate the present disclosure together with a following detailed description, and do not limit the present disclosure. In the drawings:

FIG. 4b is a cross-sectional view of the display assembly along a line BB' in FIG. 4a.

DETAIL DESCRIPTION OF EMBODIMENTS

The detailed description of the embodiments of the present disclosure will be described in details below in conjunction with the accompanying drawings. It should be understood that, the detailed description of the embodiments described herein is used only to illustrate and explain the present disclosure, not to limit the present disclosure.

Figure 1:
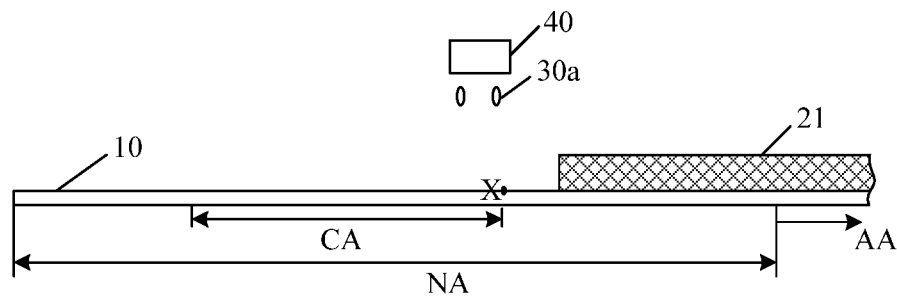
FIG. 1 is a schematic diagram illustrating coating of an adhesive onto a display panel according to an embodiment.
Figure 2:
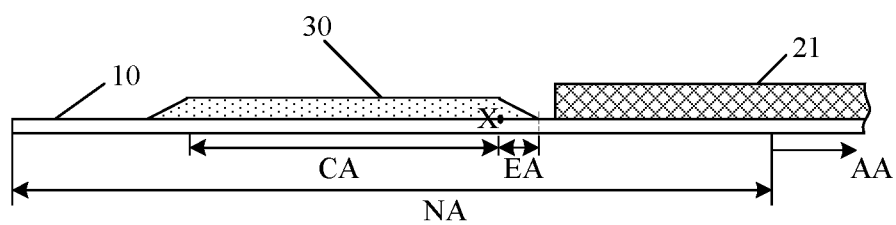
FIG. 2 is a schematic diagram illustrating a distribution of the adhesive on the display panel after being cured according to an embodiment.
Figure 3:
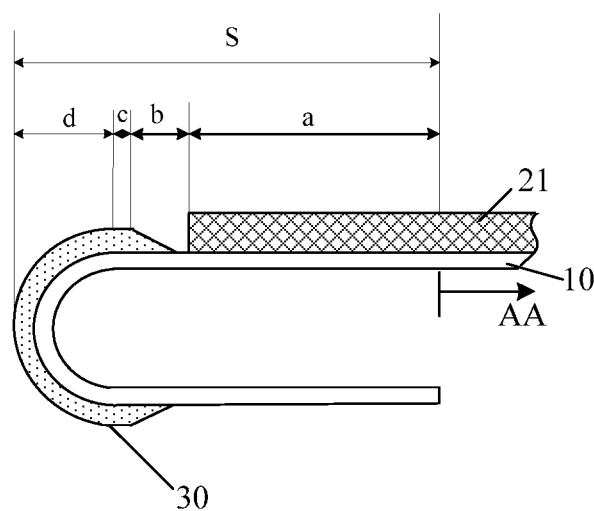
FIG. 3 is a schematic diagram illustrating the bent display panel according to an embodiment.

FIG. 1 is a schematic diagram illustrating coating of an adhesive onto a display panel according to an embodiment. FIG. 2 is a schematic diagram illustrating a distribution of the adhesive on the display panel after being cured according to an embodiment. FIG. 3 is a schematic diagram illustrating the bent display panel according to an embodiment. As shown in FIG. 1, a protection film 21 is provided on a display panel 10, and the protection film 21 covers a part of a display area AA and a part of a non-display area NA. When coating an adhesive on the display panel 10, an adhesive coating device 40 applies the adhesive 30a in an adhesive coating area CA in a direction away from the display area AA, starting from a position X spaced a certain distance from the protection film 21. Then, as shown in FIG. 2, the adhesive on the display panel 10 is cured to form a cured adhesive layer 30. Thereafter, as shown in FIG. 3, a part of the display panel 10 may be bent to a backlight side of the display area AA, thereby providing driving chips. The cured adhesive layer 30 is used to protect the bent part of the display panel 10. As shown in FIG. 2, since the adhesive has fluidity, after the adhesive falls into the adhesive coating area CA, a part of the adhesive flows out of a boundary of the adhesive coating area CA, and the area where the adhesive flows out of the adhesive coating area CA is denoted as an outward expansion area EA. A thickness of the adhesive in the outward expansion area EA gradually decreases, and the cured adhesive layer 30 is formed as a slope shape in the outward expansion area EA as shown in FIG. 2.

After the adhesive is cured, the protection film 21 needs to be peeled off, and if the adhesive flows onto an upper surface of the protection film 21, the cured adhesive layer 30 could be pulled when the protection film 21 is peeled off, so that the cured adhesive layer 30 cannot effectively protect the bent part of the display panel 10. In FIGS. 1 and 2, a certain distance is left between a starting position of the adhesive coating area CA and the protection film 21, and the distance is greater than or equal to a size of the outward expansion area CA, so that the adhesive before being cured can be prevented from flowing onto the upper surface of the protection film 21, and the cured adhesive layer 30 can be prevented from being pulled when the protection film 21 is peeled off.

After the adhesive is coated and the adhesive is cured as shown in FIG. 1, when the display panel 10 is bent, a certain distance needs to be left between a starting position of bending and the starting position of coating the adhesive, and the distance is determined according to a value of alignment precision of the adhesive coating device 40, so as to ensure that the adhesive on the bent part of the display panel 10 reaches a target thickness. After the display panel 10 is bent, a width S for a frame of the display panel 10 is shown in FIG. 3, where S=a+b+c+d; a is a distance between a boundary of the display area AA and a boundary of the protection film 21; b is a distance between the starting position of coating the adhesive and the protection film 21; c is the value of alignment precision of the adhesive coating device 40; d is the sum of a thickness of the cured adhesive layer 30 on the bent part of the display panel 10, a thickness of the display panel 10 and a bending radius.

Figure 4A:
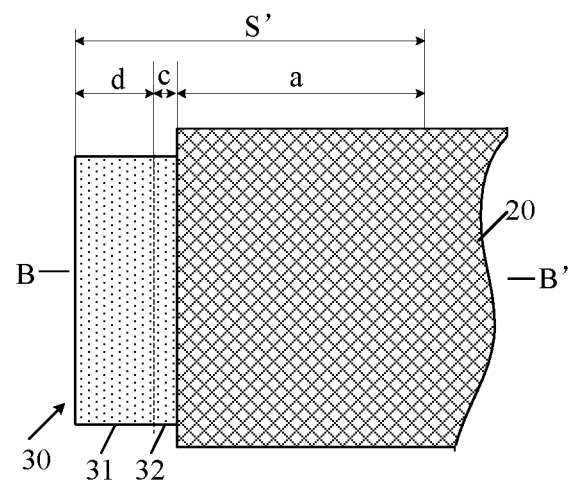
FIG. 4a is a top view illustrating a display assembly according to an embodiment of the present disclosure.
Figure 4B:
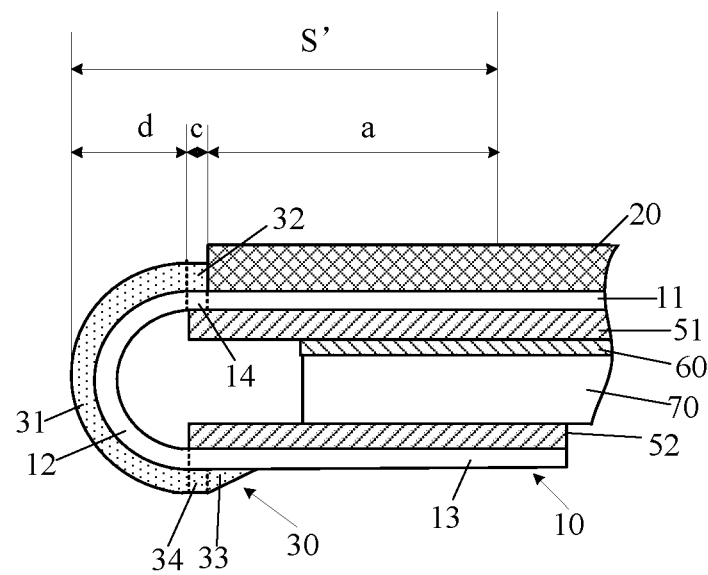

In a first aspect, an embodiment of the present disclosure provides a display assembly. FIG. 4a is a top view illustrating a display assembly according to an embodiment of the present disclosure. FIG. 4b is a cross-sectional view along a line BB' in FIG. 4 a. In combination with FIGS. 4a and 4b, the display assembly includes: a display panel 10, a blocking layer 20, and a cured adhesive layer 30.

The display panel 10 includes: a screen portion 11, a chip providing portion 13, a bendable portion 12 between the screen portion 11 and the chip providing portion 13, and a spacer portion 14 connected between the bendable portion 12 and the screen portion 11. The cured adhesive layer 30 is located outside an area of the screen portion 11, and the cured adhesive layer 30 includes: a first portion 31 covering the bendable portion 12 and a second portion 32 covering the spacer portion 14, the first portion 31 and the second portion 32 each having a thickness less than a thickness of the blocking layer 20. The second portion 32 is in contact with the blocking layer 20, and in particular, the second portion 32 is in contact with a side of the blocking layer 20. A surface of the second portion 32 of the cured adhesive layer 30 distal to the spacer portion 14 is substantially flat. It is noted that the "substantially flat" means that a difference between a maximum thickness and a minimum thickness is less than ⅕ of a maximum thickness.

Compared with the embodiment shown in FIGS. 1 to 3, in the embodiment of the present disclosure, a part of the cured adhesive layer 30 close to the blocking layer 20 is substantially flat and is not formed as a slope shape, so that when the display panel is bent to form the bendable portion 12 as a curved shape, the display panel can be bent from a position closer to the screen portion 11, so as to reduce a distance between the bendable portion 12 and the screen portion 11, which facilitates a narrow frame. Moreover, the cured adhesive layer 30 is located outside an area of the blocking layer 20, and when the blocking layer 20 needs to be peeled off subsequently, the cured adhesive layer 30 is not pulled, so that it is ensured that the cured adhesive layer 30 may effectively protect the bendable portion 12, and a quality of the display assembly is further guaranteed. Consequently, the embodiment of the present disclosure can achieve a narrow frame in the case where a quality of the display assembly is further guaranteed. Compared with FIGS. 3 and 4, a width for a frame of the display assembly provided in the embodiment of the present disclosure is S'=a+b+c, which is reduced by b than the width for the frame of the display assembly shown in FIG. 3.

In an embodiment, the display panel 10 is a flexible organic light emitting diode (OLED) display panel. The bendable portion 12 is in a bent state, and the chip providing portion 13 is located at a backlight side of the screen portion 11, for bonding driving chips. The backlight side is a side opposite to a light exit direction of the screen portion 11.

A width of the spacer portion 14 may be determined according to alignment precision of the adhesive coating device. For example, the width c of the spacer portion 14 is in a range of 120 μm to 180 μm.

In an embodiment, a thickness of the first portion 31 of the cured adhesive layer 30 is in a range of 60 μm to 120 μm, so that when the bendable portion 12 is in a bent state, the bendable portion 12 is effectively protected, and a width for a frame of the display assembly is prevented from being oversized.

In an embodiment, a thickness of the second portion 32 of the cured adhesive layer 30 is in a range of 60 μm to 90 μm, which facilitates a desired thickness of the first portion 31, and facilitates a reduced distance between the bendable portion 12 and the screen portion 11.

In an embodiment, a material of the cured adhesive layer 30 includes polyester polyurethane.

In an embodiment, the cured adhesive layer 30 further includes a third portion 33 in addition to the first portion 31 and the second portion 32, the third portion 33 is provided on the chip providing portion 13, and a thickness of the third portion 33 gradually decreases in a direction away from the bendable portion 12. When the adhesive is coated onto the display panel 10, the adhesive is coated in a direction from the screen portion 11 to the bendable portion 12, and an end position for coating is located on the chip providing portion 13, and at the end position for coating, the adhesive is formed as a shape with a gradually reduced thickness due to a flow of the adhesive, so that after being cured, the third portion 33 with a gradually reduced thickness is formed on the chip providing portion 13.

In an embodiment, a surface of the third portion 33 distal to the spacer portion 14 is a bevel. It will be appreciated that the surface of the third portion 33 distal to the spacer portion 14 may also have other shape, for example, a convex or concave curved surface.

In an embodiment, the cured adhesive layer 30 further includes a fourth portion 34 in addition to the first portion 31, the second portion 32 and the third portion 33; the fourth portion 34 is provided on the chip providing portion 13; the fourth portion 34 is connected between the first portion 31 and the third portion 33; a surface of the fourth portion 34 distal to the chip providing portion 13 is substantially flat. When the adhesive is coated on the display panel 10, an end position for coating is located at a joint between the third portion 33 and the fourth portion 34, so as to ensure that a thickness of the adhesive coated on the overall bendable portion 12 reaches a required thickness.

In an embodiment, the bendable portion 12 is in a bent state, the chip providing portion 13 is located on a backlight side of the screen portion 11, the blocking layer 20 is provided on a surface of the screen portion 11 distal to the chip providing portion 13, and a first back membrane 51 is provided on a surface of the screen portion 11 proximal to the chip providing portion 13, and the first back membrane 51 is used for protecting the screen portion 11. The second portion 32 of the cured adhesive layer 30 at least partially overlaps the first back membrane 51 in a thickness direction of the screen portion 11. When the display panel 10 is bent, the bending can be started from a boundary position of the first back membrane 51, and the first back membrane 51 at least partially overlaps the second portion 32 of the cured adhesive layer 30 in a thickness direction of the screen portion 11, so as to ensure that the adhesive layer 30 in an area where the bending just starts may reach a required thickness after the bendable portion 12 reaches the bent state.

It should be noted that, in the embodiment of the present disclosure, two membranes at least partially overlapping with each other in a thickness direction of the screen portion 11 (or the chip providing portion 13) means that orthographic projections of the two membranes on a plane perpendicular to the thickness direction of the screen portion 11 (or the chip providing portion 13) at least partially overlap with each other.

In an embodiment, a boundary of the first portion 31 of the cured adhesive layer 30 close to the bendable portion 12 is flush with a boundary of the first back membrane 51 close to the bendable portion 12, so that the first back membrane 51 is located outside an area of the bendable portion 12 to facilitate bending of the bendable portion 12.

In an embodiment, the bendable portion 12 is in a bent state, the chip providing portion 13 is located on a backlight side of the screen portion 11, the chip providing portion 13 has a first surface distal to the screen portion 11 and a second surface proximal to the screen portion 11, a part of the cured adhesive layer 30 is located on the first surface of the chip providing portion 13, and a second back membrane 52 is provided on the second surface of the chip providing portion 13. The part of the cured adhesive layer 30 on the first surface of the chip providing portion 13 at least partially overlaps the second back membrane 52 in a thickness direction of the chip providing portion 13.

In an embodiment, a heat dissipation layer 60 and a support layer 70 are provided between the first back membrane 51 and the second back membrane 52, and the heat dissipation layer 60 is provided between the support layer 70 and the screen portion 11 for dissipating heat of the display panel 10. The support layer 70 is used to maintain a certain distance between the screen portion 11 and the chip support portion 13, and keep the bendable portion 12 in a stable bent state. A material of the support layer 70 may be polyethylene terephthalate (PET).

In an embodiment, the blocking layer 20 is a protection film, for protecting the screen portion 11 of the display panel 10 before a polarizer is attached, so as to prevent the display panel 10 from being contaminated in other processes before the polarizer is attached. In an embodiment, the blocking layer 20 is a polarizer. The polarizer is a circular polarizer and is used for eliminating an influence of external light on a display picture.

According to the display assembly of the embodiment of the present disclosure, without influencing a product quality of the display assembly, the bendable portion 12 is caused to be closer to the screen portion 11, which facilitates a narrow frame.

As another aspect of the present disclosure, a display device is provided, and includes the display assembly in the above embodiments. The display device can be any product or component with a display function such as a mobile phone, a television, a display, a tablet personal computer and a navigator, and the display device can achieve a narrow frame.

As a further aspect of the present disclosure, a manufacturing method of the display assembly is provided. FIGS. 5 to 10 are schematic diagrams illustrating a manufacturing procedure of the display assembly according to an embodiment of the present disclosure, and the manufacturing method of the display assembly includes the following steps S101 to S104, as shown in FIG. 11.

Figure 5:
FIGS. 5 to 10 are schematic diagrams illustrating a manufacturing procedure of the display assembly according to an embodiment of the present disclosure.

Step S101, preparing a display panel 10. As shown in FIG. 5, the display panel 10 includes: a screen portion 11, a chip providing portion 13, a bendable portion 12 between the screen portion 11 and the chip providing portion 13, and a spacer portion 14 connected between the bendable portion 12 and the screen portion 11. The display panel 10 may be a flexible organic light emitting diode (OLED) display panel, and the chip providing portion 13 is used for providing driving chips, and the driving chips may be provided on the chip providing portion 13 by bonding. The screen portion 11 may include: a display area for displaying images and a part of a non-display area outside the display area.

Figure 6:
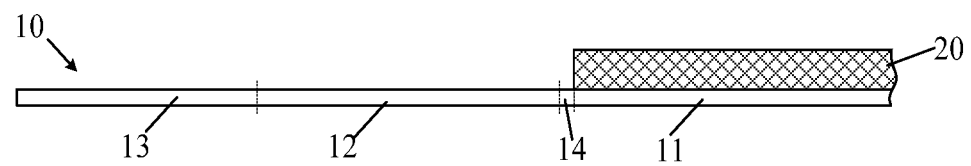

Step S102, forming a blocking layer 20 on the screen portion 11, as shown in FIG. 6.

Figure 8:
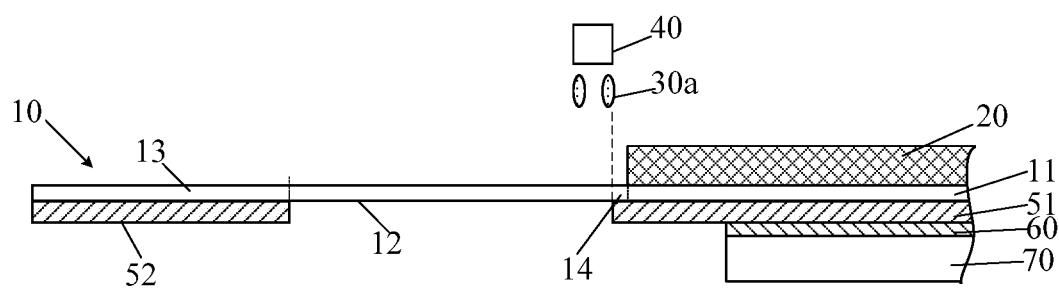

Step S103, forming an adhesive layer with a thickness less than that of the blocking layer 20 on the display panel 10. The adhesive layer may be formed by coating, and as shown in FIG. 8, adhesive 30a is coated on the display panel 10 to form the adhesive layer. The adhesive layer is a layer formed when the adhesive coated on the display panel 10 reaches a stable state. The adhesive layer is located outside an area of the screen portion 11 and at least covers the bendable portion 12 and the spacer portion 14, and the adhesive layer is in contact with the blocking layer 20.

In the step S103, the adhesive 30a may be coated on the display panel 10 by using an adhesive coating device 40, and the adhesive coating device 40 is a device having an adhesive outlet, such as a dropper.

Figure 9:
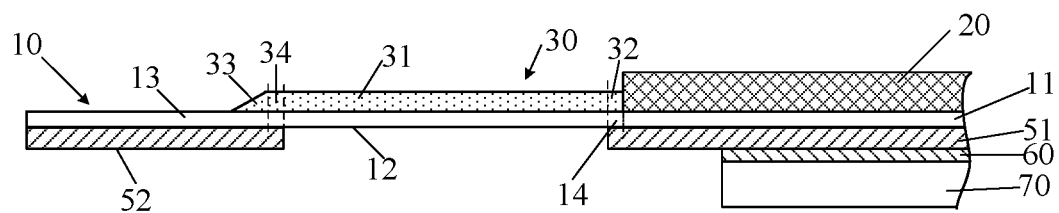

Step S104, curing the adhesive layer on the display panel 10. As shown in FIG. 9, the cured adhesive layer 30 is located outside an area of the screen portion 11, and the cured adhesive layer 30 includes: a first portion 31 covering the bendable portion 12 and a second portion 32 covering the spacer portion 14, the first portion 31 and the second portion 32 each have a thickness less than a thickness of the blocking layer 20. The cured adhesive layer 30 is in contact with the blocking layer 20, and in particular, the cured adhesive layer 30 is in contact with a side of the blocking layer 20. A surface of the second portion 32 of the cured adhesive layer 30 distal to the spacer portion 14 is substantially flat.

In step S104, the adhesive layer may be cured by ultraviolet light.

In the embodiment of the present disclosure, a part of the cured adhesive layer 30 close to the blocking layer 20 is substantially flat without forming a slope shape, and therefore, when the display panel is bent such that the bendable portion 12 is formed as a curved shape, the display panel may be bent from a position closer to the screen portion 11, reducing a distance between the bendable portion 12 and the screen portion 11, which facilitates a narrow frame. Moreover, because a thickness of the blocking layer 20 is greater than that of the cured adhesive layer 30, when the blocking layer 20 needs to be peeled off later, the cured adhesive layer 30 is not pulled, so that it is ensured that the cured adhesive layer 30 may effectively protect the bendable portion 12, and a quality of the display assembly is further guaranteed. Therefore, the manufacturing method provided by the embodiment of the present disclosure may achieve a narrow frame in the case where a quality of the display assembly is further guaranteed.

In addition, with the adhesive coating method of the embodiment of the present disclosure, it is not required to adjust conditions such as raw materials in an adhesive coating process and an alignment precision of an adhesive coating device, which can reduce a production cost.

In an embodiment, the adhesive is polyester polyurethane (e.g., MCL adhesive).

The manufacturing method provided by the embodiment of the present disclosure will be described below with reference to FIGS. 5 to 10, and the manufacturing method includes step S101 to step S105, as shown in FIG. 11.

Step 101, preparing a display panel 10. As shown in FIG. 5, the display panel 10 includes: a screen portion 11, a chip providing portion 13, a bendable portion 12 between the screen portion 11 and the chip providing portion 13, and a spacer portion 14 connected between the bendable portion 12 and the screen portion 11. The chip providing portion 13 has a first surface and a second surface opposite to each other.

Step S102, forming a blocking layer 20 on the screen portion 11, as shown in FIG. 6.

Figure 7:
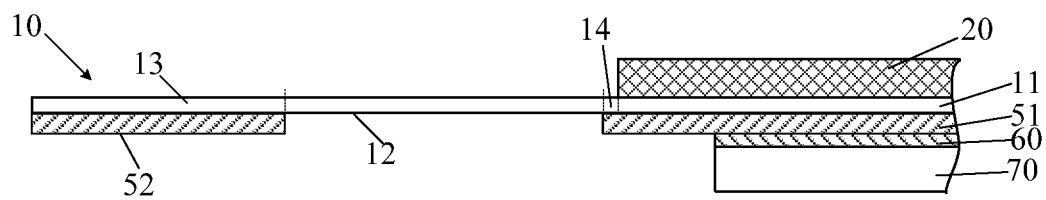

Step S1021, as shown in FIG. 7, forming a first back membrane 51 on a surface of the screen portion 11 distal to the blocking layer 20, and forming a second back membrane 52 on the second surface of the chip providing portion 13; successively forming a heat dissipation layer 60 and a support layer 70 on a side of the first back membrane 51 distal to the screen section 11.

It is noted that the sequential order of step S102 and step S1021 is not particularly limited, and for example, step S102 may be performed before step S1021 or after step S1021.

Step S103, forming an adhesive layer with a thickness less than that of the blocking layer 20.

In an embodiment, specifically, step S103 includes: adhesive 30a is coated in a direction from the screen portion 11 to the chip providing portion 13 from a position adjacent to the blocking layer 20, to form an adhesive layer. In this way, after the adhesive layer is cured, a required thickness may be achieved at a position adjacent to the blocking layer 20, so as to minimize a distance between a start position for bending of the bendable portion 12 and the screen portion 11, thereby reducing a width of the frame, to an extreme.

An alignment error of the adhesive coating device 40 at a start position for coating is small compared to an end position for coating, and therefore, when the adhesive is applied in a direction from the screen portion 11 to the chip providing portion 13, it is advantageous to control a thickness and position of an end of the adhesive layer close to the blocking layer 20.

Step S104, curing the adhesive layer on the display panel 10. As shown in FIG. 9, the cured adhesive layer 30 is located outside an area of the screen portion 11, and the cured adhesive layer 30 includes: a first portion 31 covering the bendable portion 12 and a second portion 32 covering the spacer portion 14, the first portion 31 and the second portion 32 each have a thickness less than a thickness of the blocking layer 20. The cured adhesive layer 30 is in contact with the blocking layer 20, and in particular, the cured adhesive layer 30 is in contact with a side of the blocking layer 20. A surface of the second portion 32 of the cured adhesive layer 30 distal to the spacer portion 14 is substantially flat.

In an embodiment, the second portion 32 of the cured adhesive layer 30 at least partially overlaps the first back membrane 51 in a thickness direction of the screen portion 11.

In an embodiment, in step S103, the end position for coating is located on the chip providing portion 13. In this case, a part of the cured adhesive layer 30 is located on the first surface of the chip providing portion 13, and the part of the cured adhesive layer 30 on the first surface of the chip providing portion 13 at least partially overlaps the second back membrane 52 in a thickness direction of the chip providing portion 13.

In an embodiment, the cured adhesive layer 30 further includes a third portion 33 provided on the chip providing portion 13 in addition to the first portion 31 and the second portion 32, and a thickness of the third portion 33 gradually decreases in a direction away from the bendable portion 12.

In an embodiment, the cured adhesive layer 30 further includes a fourth portion 34, in addition to the first portion 31, the second portion 32 and the third portion 33, the fourth portion 34 is provided on the chip providing portion 13, the fourth portion 34 is located between the first portion 31 and the third portion 33, and a surface of the fourth portion 34 distal to the chip providing portion 13 is substantially flat. When the adhesive is coated on the display panel 10, an end position for coating is located at a joint between the third portion 33 and the fourth portion 34, so as to ensure that a thickness of the adhesive coated on the overall bendable portion 12 reaches a required thickness.

In an embodiment, a thickness of the adhesive layer on the bendable portion 12 is in a range of 60 μm to 120 μm, so that the cured adhesive layer 30 may effectively protect the bendable portion 12.

Figure 10:
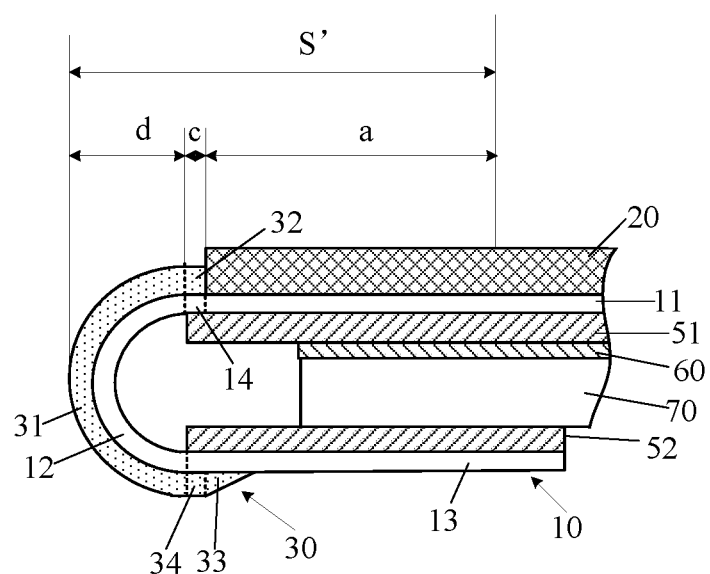
Figure 11:
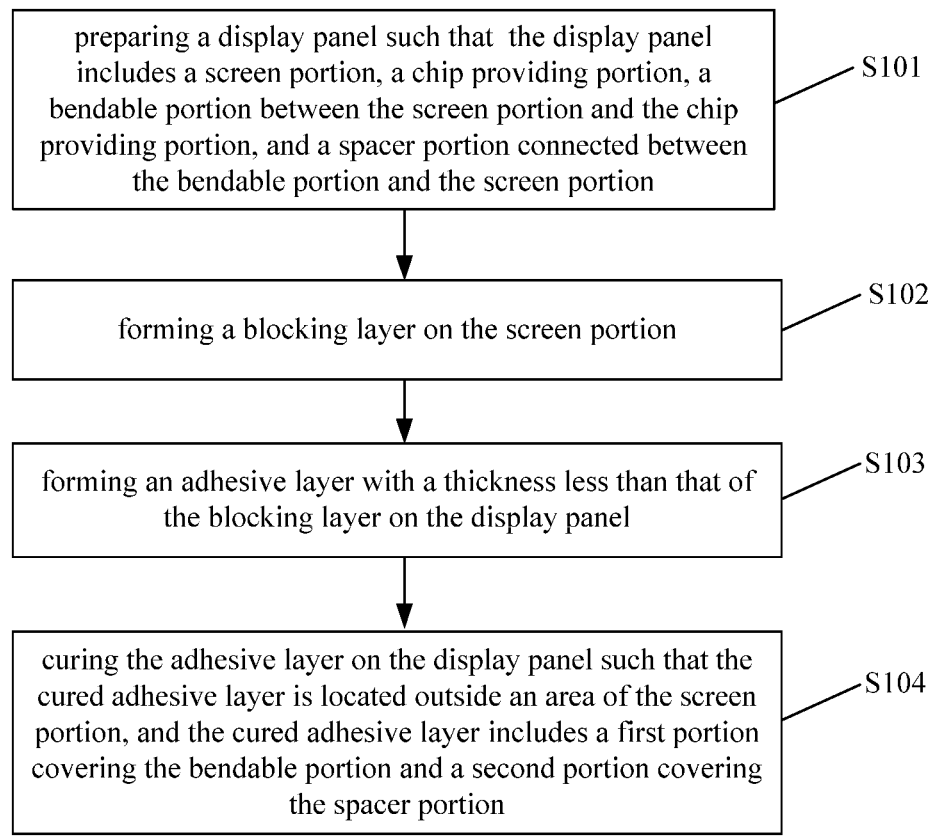
FIG. 11 is a flowchart of a manufacturing method of a display assembly according to an embodiment of the present disclosure.
Figure 12:
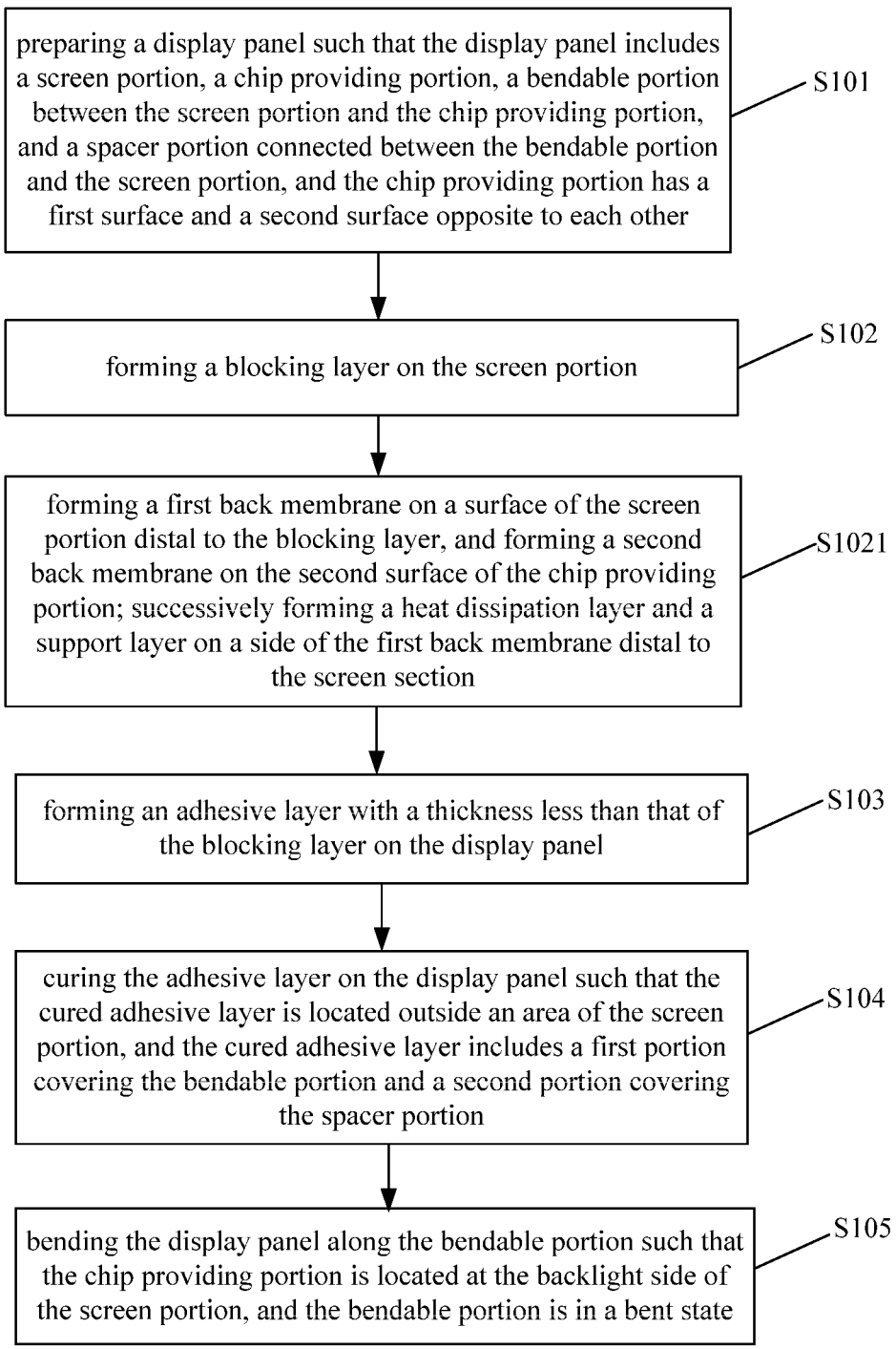
FIG. 12 is a flowchart of a manufacturing method of a display assembly according to an embodiment of the present disclosure.

Step S105, as shown in FIG. 10, bending the display panel 10 along the bendable portion 12, so that the chip providing portion 13 is located at the backlight side of the screen portion 11, and the bendable portion 12 is in a bent state. At this time, the first surface of the chip providing portion 13 is distal to the screen portion 11, and the second surface of the chip providing portion 13 is proximal to the screen portion 11.

In an embodiment, the blocking layer 20 is a protection film, such as a temporary protection film (TPF), which is used to protect the screen portion 11 of the display panel 10 before a polarizer is attached, and to prevent the display panel 10 from being contaminated in other processes before the polarizer is attached. The protection film may be a polyethylene film. In this case, the protection film may be peeled off after step S104, and then the polarizer may be attached on the screen portion 11 of the display panel 10. The polarizer is a circular polarizer and is used for eliminating an influence of external light on the display picture.

In an embodiment, the blocking layer 20 is a polarizer. Since the polarizer is not required to be peeled off, when the blocking layer 20 is a polarizer, even if a small amount of adhesive is coated to the polarizer, the cured adhesive layer 30 is not pulled.

It will be understood that, the above embodiments are merely exemplary embodiments employed to illustrate the principles of the present disclosure, but the present disclosure is not limited thereto. It will be apparent to those skilled in the art that various changes and modifications may be made therein without departing from the spirit and scope of the present disclosure, and these changes and modifications are to be considered within the scope of the present disclosure.

What is claimed is:

1. A display assembly, comprising:
   a display panel, comprising: a screen portion, a chip providing portion, a bendable portion between the screen portion and the chip providing portion, and a spacer portion between the bendable portion and the screen portion;
   a blocking layer on the screen portion;
   a cured adhesive layer outside an area of the screen portion and comprising: a first portion covering the bendable portion and a second portion covering the spacer portion, the first portion and the second portion each having a thickness less than that of the blocking layer, wherein the second portion is in contact with the blocking layer, and a surface of the second portion distal to the spacer portion is substantially flat;
   wherein the cured adhesive layer further comprises a third portion on the chip providing portion, and a thickness of the third portion is gradually reduced along a direction far away from the bendable portion;
   the cured adhesive layer further comprises a fourth portion on the chip providing portion, the fourth portion is connected between the first portion and the third portion, and a surface of the fourth portion distal to the chip providing portion is substantially flat; and
   the first portion, the third portion and the fourth portion therebetween are formed as a single piece;
   surfaces of the first portion, the third portion and the fourth portion facing to the chip providing portion are formed as a single flat surface, and a distance between a surface of the third portion away from the chip providing chip and the single flat surface is gradually reduced along a direction far away from the bendable portion.

2. The display assembly of claim 1, wherein a surface of the third portion distal to the spacer portion is a bevel.

3. The display assembly of claim 1, wherein the bendable portion is in a bent state, and the chip providing portion is on a backlight side of the screen portion.

4. The display assembly of claim 3, wherein the blocking layer is on a surface of the screen portion distal to the chip providing portion, a first back membrane is provided on a surface of the screen portion proximal to the chip providing portion, and the second portion of the cured adhesive layer at least partially overlaps the first back membrane in a thickness direction of the screen portion.

5. The display assembly of claim 4, wherein a boundary of the first portion of the cured adhesive layer close to the bendable portion is flush with a boundary of the first back membrane close to the bendable portion.

6. The display assembly of claim 3, wherein the chip providing portion has a first surface distal to the screen portion and a second surface proximal to the screen portion, a part of the cured adhesive layer is on the first surface of the chip providing portion, a second back membrane is on the second surface of the chip providing portion, and the part of the cured adhesive layer on the first surface of the chip providing portion at least partially overlaps the second back membrane in a thickness direction of the chip providing portion.

7. The display assembly of claim 1, wherein a thickness of the first portion of the cured adhesive layer is in a range of 60 μm to 120 μm.

8. The display assembly of claim 1, wherein the second portion of the cured adhesive layer has a thickness in a range of 60 μm to 90 μm.

9. The display assembly of claim 1, wherein the blocking layer is a protection film.

10. The display assembly of claim 1, wherein the blocking layer is a polarizer.

11. A display device comprising the display assembly of claim 1.

12. A manufacturing method of a display assembly, comprising:
    preparing a display panel, the display panel comprising: a screen portion, a chip providing portion, a bendable portion located between the screen portion and the chip providing portion, and a spacer portion connected between the bendable portion and the screen portion;
    forming a blocking layer on the screen portion;
    forming an adhesive layer on the display panel;
    curing the adhesive layer, wherein the cured adhesive layer is located outside an area of the screen portion, and the cured adhesive layer comprises: a first portion covering the bendable portion and a second portion covering the spacer portion, the first portion and the second portion each having a thickness less than that of the blocking layer, wherein the second portion is in contact with the blocking layer, and a surface of the second portion distal to the spacer portion is substantially flat;
    wherein the forming an adhesive layer on the display panel comprises: coating adhesive along a direction from the screen portion to the chip providing portion, starting from a position adjacent to the blocking layer, to form the adhesive layer;
    wherein the coating adhesive along a direction from the screen portion to the chip providing portion comprises coating adhesive starting from the position adjacent to the blocking layer to an end position located on the chip providing portion such that the cured adhesive layer further comprises a third portion on the chip providing portion, and a thickness of the third portion is gradually reduced along a direction far away from the bendable portion; and
    wherein the cured adhesive layer further comprises a fourth portion provided on the chip providing portion, the fourth portion is connected between the first portion and the third portion, a surface of the fourth portion distal to the chip providing portion is substantially flat; and
    the first portion, the third portion and the fourth portion therebetween are formed as a single piece;
    surfaces of the first portion, the third portion and the fourth portion facing to the chip providing portion are formed as a single flat surface, and a distance between a surface of the third portion away from the chip providing chip and the single flat surface is gradually reduced along a direction far away from the bendable portion.

13. The manufacturing method of claim 12, wherein the curing the adhesive layer further comprises:
    bending the display panel along the bendable portion such that the chip providing portion is located on a backlight side of the screen portion, and the bendable portion is in a bent state.

14. The manufacturing method of claim 13, wherein before the bending the display panel along the bendable portion, the method further comprises:
    forming a first back membrane on a surface of the screen portion distal to the blocking layer, wherein the second portion of the cured adhesive layer at least partially overlaps the first back membrane in a thickness direction of the screen portion.

15. The manufacturing method of claim 13, wherein a part of the cured adhesive layer is located on a first surface of the chip providing portion,
    before the bending the display panel along the bendable portion, the method further comprises: forming a second back membrane on a second surface of the chip providing portion, wherein the cured adhesive layer on the first surface of the chip providing portion at least partially overlaps the second back membrane in a thickness direction of the chip providing portion;
    the bending the display panel along the bendable portion comprises bending the display panel along the bendable portion such that the first surface of the chip providing portion is distal to the screen portion, and the second surface of the chip providing portion is proximal to the screen portion.

16. A display assembly, comprising:
    a display panel, comprising: a screen portion, a chip providing portion, a bendable portion between the screen portion and the chip providing portion, and a spacer portion between the bendable portion and the screen portion;
    a blocking layer on the screen portion; and
    a cured adhesive layer outside an area of the screen portion and comprising: a first portion covering the bendable portion and a second portion covering the spacer portion, the first portion and the second portion each having a thickness less than that of the blocking layer, wherein the second portion is in contact with the blocking layer, and a surface of the second portion distal to the spacer portion is substantially flat;
    wherein a thickness of the first portion of the cured adhesive layer is in a range of 60 μm to 120 μm, and the second portion of the cured adhesive layer has a thickness in a range of 60 μm to 90 μm.

17. The display assembly of claim 16, wherein the cured adhesive layer further comprises a third portion on the chip providing portion, and a thickness of the third portion is gradually reduced along a direction far away from the bendable portion;

the cured adhesive layer further comprises a fourth portion on the chip providing portion, the fourth portion is connected between the first portion and the third portion, and a surface of the fourth portion distal to the chip providing portion is substantially flat;

the first portion, the third portion and the fourth portion therebetween are formed as a single piece; and surfaces of the first portion, the third portion and the fourth portion facing to the chip providing portion are formed as a single flat surface, and a distance between a surface of the third portion away from the chip providing chip and the single flat surface is gradually reduced along a direction far away from the bendable portion.

18. The display assembly of claim 16, wherein a surface of the third portion distal to the spacer portion is a bevel.

19. The display assembly of claim 16, wherein the bendable portion is in a bent state, and the chip providing portion is on a backlight side of the screen portion.

20. The display assembly of claim 19, wherein the blocking layer is on a surface of the screen portion distal to the chip providing portion, a first back membrane is provided on a surface of the screen portion proximal to the chip providing portion, and the second portion of the cured adhesive layer at least partially overlaps the first back membrane in a thickness direction of the screen portion.

* * * * *